US012609716B2

(12) United States Patent
Zhang et al.

(10) Patent No.: US 12,609,716 B2
(45) Date of Patent: Apr. 21, 2026

(54) ON-THE-FLY CRC CALCULATION FOR A HORIZONTAL LAYERED LDPC DECODER

(71) Applicant: SK hynix Inc., Gyeonggi-do (KR)

(72) Inventors: Fan Zhang, San Jose, CA (US);
Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 18/810,430

(22) Filed: Aug. 20, 2024

(65) Prior Publication Data

US 2026/0058673 A1     Feb. 26, 2026

(51) Int. Cl.
    *H03M 13/00*      (2006.01)
    *H03M 13/09*      (2006.01)
    *H03M 13/11*      (2006.01)

(52) U.S. Cl.
    CPC ....... *H03M 13/09* (2013.01); *H03M 13/1174* (2013.01)

(58) Field of Classification Search
    CPC ... H03M 13/11; H03M 13/09; H03M 13/1174
    See application file for complete search history.

(56) References Cited

U.S. PATENT DOCUMENTS

| | | | | |
|---|---|---|---|---|
| 8,392,789 B2 * | 3/2013 | Biscondi | ........... | H03M 13/1114 |
| | | | | 714/755 |
| 9,548,759 B1 * | 1/2017 | Rad | ................... | H03M 13/6516 |
| 9,838,033 B1 * | 12/2017 | Bear | ....................... | H03M 7/40 |
| 9,977,713 B2 * | 5/2018 | Kang | ................ | H03M 13/1111 |
| 10,020,820 B2 * | 7/2018 | Yuan | .................... | H03M 13/116 |
| 10,116,332 B2 * | 10/2018 | Noh | ...................... | H04L 1/1819 |
| 10,725,860 B2 * | 7/2020 | Avraham | ............... | G11C 29/52 |
| 11,138,069 B2 * | 10/2021 | Perlmutter | .......... | G06F 11/1012 |
| 11,736,229 B2 * | 8/2023 | Loghin | ............. | H03M 13/6356 |
| | | | | 714/776 |
| 11,755,407 B2 * | 9/2023 | Avraham | ............ | G06F 11/1012 |
| | | | | 714/758 |
| 12,393,189 B2 * | 8/2025 | Takeyasu | ............. | G05D 1/0061 |
| 2011/0283158 A1 * | 11/2011 | Yang | ................... | H03M 13/114 |
| | | | | 714/752 |

* cited by examiner

*Primary Examiner* — Esaw T Abraham
(74) *Attorney, Agent, or Firm* — IP & T GROUP LLP

(57) ABSTRACT

A method and memory system for on-the-fly horizontal layer error code processing of data for memory storage and retrieval. The method and associated system provide for generating a parity check matrix H1 including a payload portion and a parity portion, rearranging user data circulants within rows of the payload portion to different row positions; and forming a bottom-sorted party check matrix H2 from the rearranged user data circulants.

18 Claims, 10 Drawing Sheets

Figure 3:
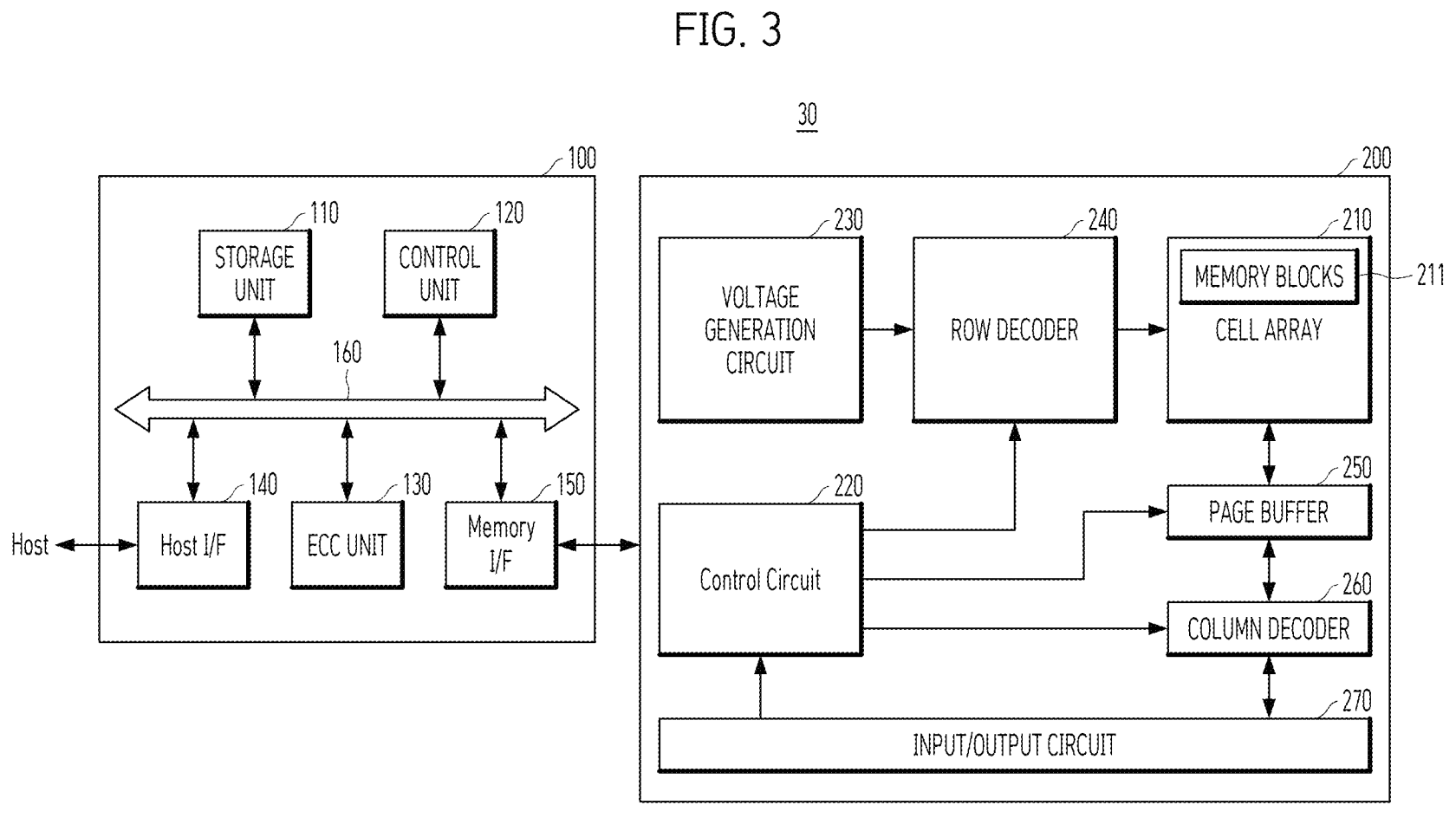

211 MEMORY BLOCKS

CELL ARRAY

250 PAGE BUFFER

260 COLUMN DECODER

270 INPUT/OUTPUT CIRCUIT

240 ROW DECODER

230 VOLTAGE GENERATION CIRCUIT

220 Control Circuit

100

120 CONTROL UNIT

110 STORAGE UNIT

150 Memory I/F

130 ECC UNIT

140 Host I/F

160

Host

FIG. 5

Read Processor ~500

Decoder ~510

CRC Calculator ~515

Storage ~550

Decoded
Codewords

600

Information data(610)

| User data/DPP | Metadata | CRC | LDPC parity |
|---|---|---|---|

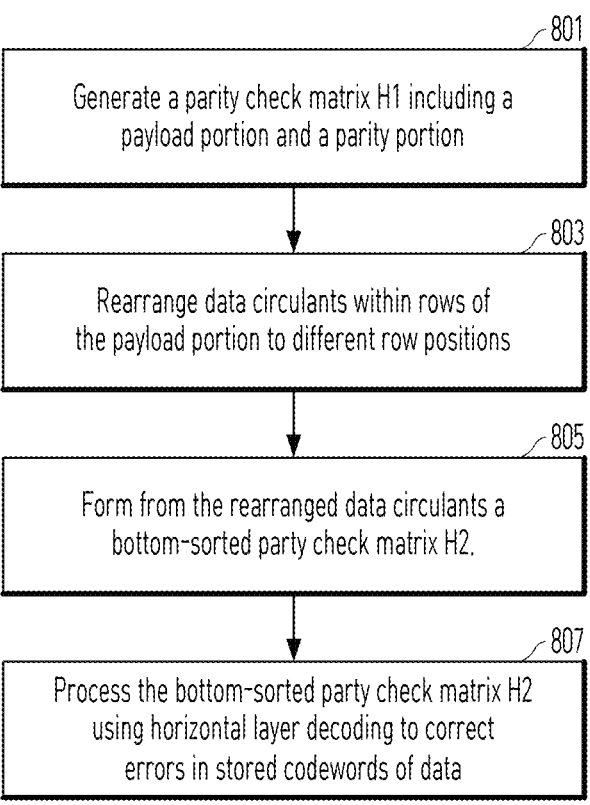

801

Generate a parity check matrix H1 including a
payload portion and a parity portion

803

Rearrange data circulants within rows of
the payload portion to different row positions

805

Form from the rearranged data circulants a
bottom-sorted party check matrix H2.

807

Process the bottom-sorted party check matrix H2
using horizontal layer decoding to correct
errors in stored codewords of data

ON-THE-FLY CRC CALCULATION FOR A HORIZONTAL LAYERED LDPC DECODER

BACKGROUND

1. Field

The present invention relates to the processing of low-density parity-check (LDPC) codes in solid-state drives.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid-state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device-specific, and in most cases, can be updated. One type of flash memory components is named NAND after the NAND logic gates in this SSD. The NAND-type flash memory may be written and read in blocks (or pages) which are generally much smaller than the entire memory space. The NAND-type operates primarily in memory cards, USB flash drives, solid-state drives, and similar products, for general storage and transfer of data.

NAND flash manufacturers have been pushing the limits of their fabrication processes towards 20 nm and lower, which often leads to a shorter usable lifespan and a decrease in data reliability. Accordingly, error correction is needed to improve the data integrity.

In this context, embodiments of the present invention for processing LDPC codes arise.

SUMMARY

In accordance with one embodiment of the present invention, there is provided a method for on-the-fly horizontal layer error code processing of data for memory storage and retrieval. The method generates a parity check matrix H1 including a payload portion and a parity portion, rearranges user data circulants within rows of the payload portion to different row positions; and forms a bottom-sorted party check matrix H2 from the rearranged user data circulants.

In accordance with another embodiment of the present invention, there is provided a memory system for on-the-fly horizontal layer error code processing of data. The system provides for generating a parity check matrix H1 including a payload portion and a parity portion, rearranging user data circulants within rows of the payload portion to different row positions; and forming a bottom-sorted party check matrix H2 from the rearranged user data circulants.

BRIEF DESCRIPTION OF THE DRAWINGS

FIG. 3 is a block diagram illustrating a memory system in accordance with embodiments of the present invention.

FIG. 5 is a diagram illustrating a storage system in accordance with embodiments of the present invention.

FIG. 8 is a flow chart illustrating a method for on-the-fly horizontal layer error code processing of data for memory storage and retrieval according to another embodiment of the present invention.

DETAILED DESCRIPTION

Figure 1:
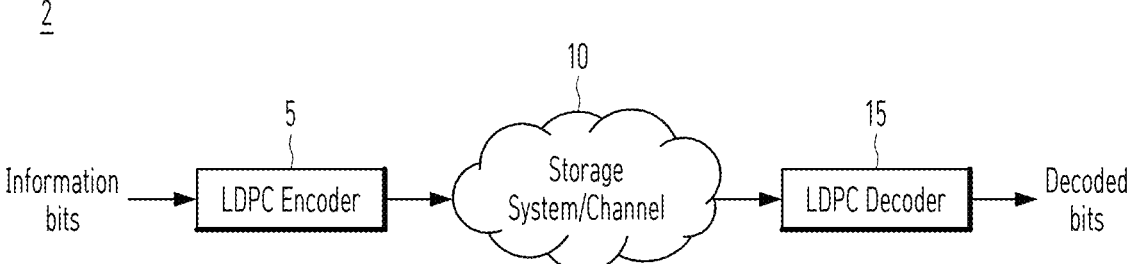
FIG. 1 is a high-level block diagram illustrating an error correcting system in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention encompasses numerous alternatives, modifications and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

FIG. 1 is a high-level block diagram illustrating an error correcting system 2, in accordance with embodiments of the present invention. More specifically, the high-level block diagram in FIG. 1 shows error correcting system 2 including an encoder 5 and a decoder 15 using for example LDPC coding and decoding algorithms. That is, error correcting system 2 may include a LDPC encoder 5 and a LDPC decoder 15, although other coding and decoding algorithms can be used.

Figure 2:
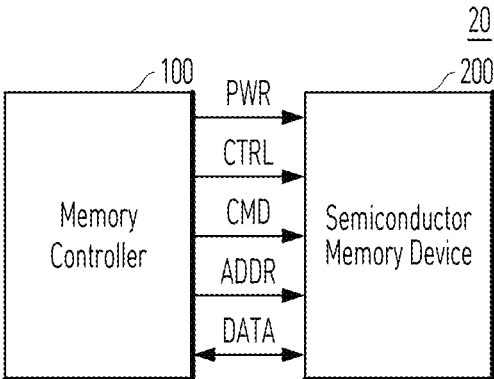
FIG. 2 is a block diagram schematically illustrating a memory system in accordance with embodiments of the present invention.

The LDPC encoder 5 may receive information bits including data which is desired to be stored in a storage system 10 (such as in memory system 20 of FIG. 2). The LDPC encoder 5 may encode the information bits to output LDPC encoded data by calculating LDPC parity and appending it to the data containing the information bits. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding of data received from the storage system 10, which may include some noise or errors. In various embodiments, the LDPC decoder 15 may perform LDPC decoding using as determined by input bit values as determined by soft or hard decisions and/or reliability information for the received data. The decoded bits generated by the LDPC decoder 15 are transmitted to the appropriate entity (e.g., the user or application which requested it). With proper encoding and decoding, the information bits match the decoded bits.

When the stored data in storage system 10 is requested or otherwise desired (e.g., by an application or user which stored the data), the LDPC decoder 15 may receive data from the storage system 10. The received data may include some noise or errors. The LDPC decoder 15 may perform detection on the received data and output bit values and/or reliability information. The LDPC decoder 15 may include one of a soft detector and a hard detector. Either the soft detector or the hard detector can provide channel information for decoders, such as the LDPC decoder. For example, the soft detector may output reliability information and a bit value decision for each detected bit. On the other hand, the hard detector may output a hard decision on each bit without providing corresponding reliability information. As an example, the hard detector may output as the hard decision that a particular bit is a "1" or a "0" without indicating how certain or sure the detector is in that decision. In contrast, the soft detector may output a bit value decision and reliability information associated with the decision. In general, reliability information indicates how certain the detector is in a given bit value decision. In one example, a soft detector may output a log-likelihood ratio (LLR) where the sign indicates the decision (e.g., a positive value corresponds to a "0" decision and a negative value corresponds to a "1" decision) and the magnitude indicates how sure or certain the detector is in that bit value decision (e.g., a large magnitude indicates a high reliability or certainty).

LDPC decoder 15 may perform LDPC decoding using the decision and/or reliability information. The decoded bits generated by the LDPC decoder 15 can be transmitted to the appropriate entity (e.g., the user or application which requested it). With proper encoding and decoding, the information bits match the decoded bits.

In LDPC decoding, a syndrome update may check to see if all of the errors have been removed from a codeword containing user data or bit data. For example, if for the parity-check matrix H, the LDPC syndrome vector $\hat{c}H=0$, and thus the checksum representing the number of nonzero elements in the syndrome vector is 0, then the syndrome update can determine that decoding is successful and all errors have been removed from the codeword. If so, the LDPC decoding stops decoding and outputs $\hat{c}=[\hat{c}1, \hat{c}2, \ldots \hat{c}N]$ as the decoded output.

If the LDPC checksum is not equal to zero and thus the LDPC checksum is not equal to zero, the decoded codeword (i.e., $\hat{c}$) is not output and another decoding iteration is performed until a maximum number of iterations, which may be predefined, is reached. In other words, a variable node update calculates new variable to check node (V2C) messages and new log likelihood ratios (LLR) values, the check node update calculates new check to variable node (C2V) messages, and the codeword update calculates a new codeword and checks if the product of the new codeword and the parity-check matrix is 0, that is $\hat{c}H=0$.

If a correct codeword is not found, the iterations continue with another update from the variable nodes using the messages that they received from the check nodes to decide if the bit at their position should be a zero or in some embodiments a one by a majority rule. The variable nodes then send this hard decision message to the check nodes that are connected to them. The iterations continue until a correct codeword is found.

In some embodiments, an LDPC decoding operation may be performed according to bit-flipping decoding. In bit-flipping decoders, the decoder may process a fixed number W of variable nodes (VN) in one clock-cycle. That is for each of the VNs to be processed in a cycle, the decoder counts the number of neighboring check nodes (CN) that are unsatisfied and compares this number with a threshold T. If the count is larger than the threshold T, the decoder flips the current bit-value of the VN. The variable nodes are typically each processed one-by-one from the first variable node to the last variable node. In some other embodiments, an LDPC decoding operation may be performed based on min-sum decoding.

FIG. 2 is a block diagram schematically illustrating a memory system 20 in accordance with one embodiment of the present invention.

Referring FIG. 2, the memory system 20 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device such as a NAND memory for storing data therein.

The memory controller 100 and the semiconductor memory device 200 may be integrated in a single semiconductor device such as a memory card. For example, the memory controller 100 and the semiconductor memory device 200 may be integrated in a single semiconductor device configured to have a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), or a universal flash storage (UFS).

In another example, the memory system 20 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

FIG. 3 is a detailed block diagram illustrating various embodiments of memory system 30. For example, memory system 30 of FIG. 3 may depict the storage system 10 shown in FIG. 1 or the memory system 20 shown in FIG. 2.

Referring to FIG. 3, the memory system 30 may include the memory controller 100 and the semiconductor memory device 200. The memory system 30 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder or a digital video player. In some embodiments, the host device may include a portable electronic device such as a mobile phone, a smart phone, an e-book, an MP3 player, a portable multimedia player (PMP), or a portable game player.

The memory device 200 may store data to be accessed by the host device.

The memory device 200 may be implemented with various memory devices such a NAND flash memory, which is particularly advantageous for reasons noted below. However, the present invention is not so limited and other volatile and non-volatile memory devices may be used such as for example a dynamic random access memory (DRAM) and a static random access memory (SRAM), a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host. The controller 100 may provide the data read from the memory device 200, to the host, and store the data provided from the host into the memory device 200. In one embodiment, especially for NAND flash based memory systems, memory controller 100 may include a scrambler for scrambling data, which is to be written to the memory device 200, and a descrambler for descrambling data, which is read from the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

Referring to FIG. 3, the control unit 120 may control general operations of the memory system 30, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as an LDPC code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The ECC unit 130 may invoke cyclic redundancy checking (CRC). Several schemes and devices have been utilized in error control. Perhaps the most common method of detecting errors is the use of parity. For example, the digits of a binary word are inspected and an extra digit or bit (binary-digit) is added. This digit is chosen to be "zero" or "one", as necessary to keep the total number of digits in the "one" state either odd or even according to a predetermined convention. Another single-error correcting code is the Hamming code where parity checked digits are assigned to particular positions where their weights indicate which digits of the whole code are in error. Still other techniques utilize sum checks.

Because the digits are transmitted serially, impulsive noise from the communication channel affects a sequence of adjacent digits as well. One technique for error detection utilizes a cyclic redundant check character for detecting such errors. In this technique, a finite length of an original sequence of characters is divided by an operator to produce a remainder. The actual transmission comprises the original sequence followed by the remainder. At the receiver, a similar division process produces a locally generated remainder for comparison with that sent by the transmitter. Any differences in the two remainders indicate an error in the transmitted data.

As shown in FIG. 3, host interface 140 may communicate with the host device through one or more of various interface protocols such as a universal serial bus (USB), a multimedia card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control unit (e.g., CPU) 120. When the memory device 200 is a flash memory such as a NAND flash memory, the memory interface 150 may generate control signals for the memory and process data under the control of the control unit 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 4:
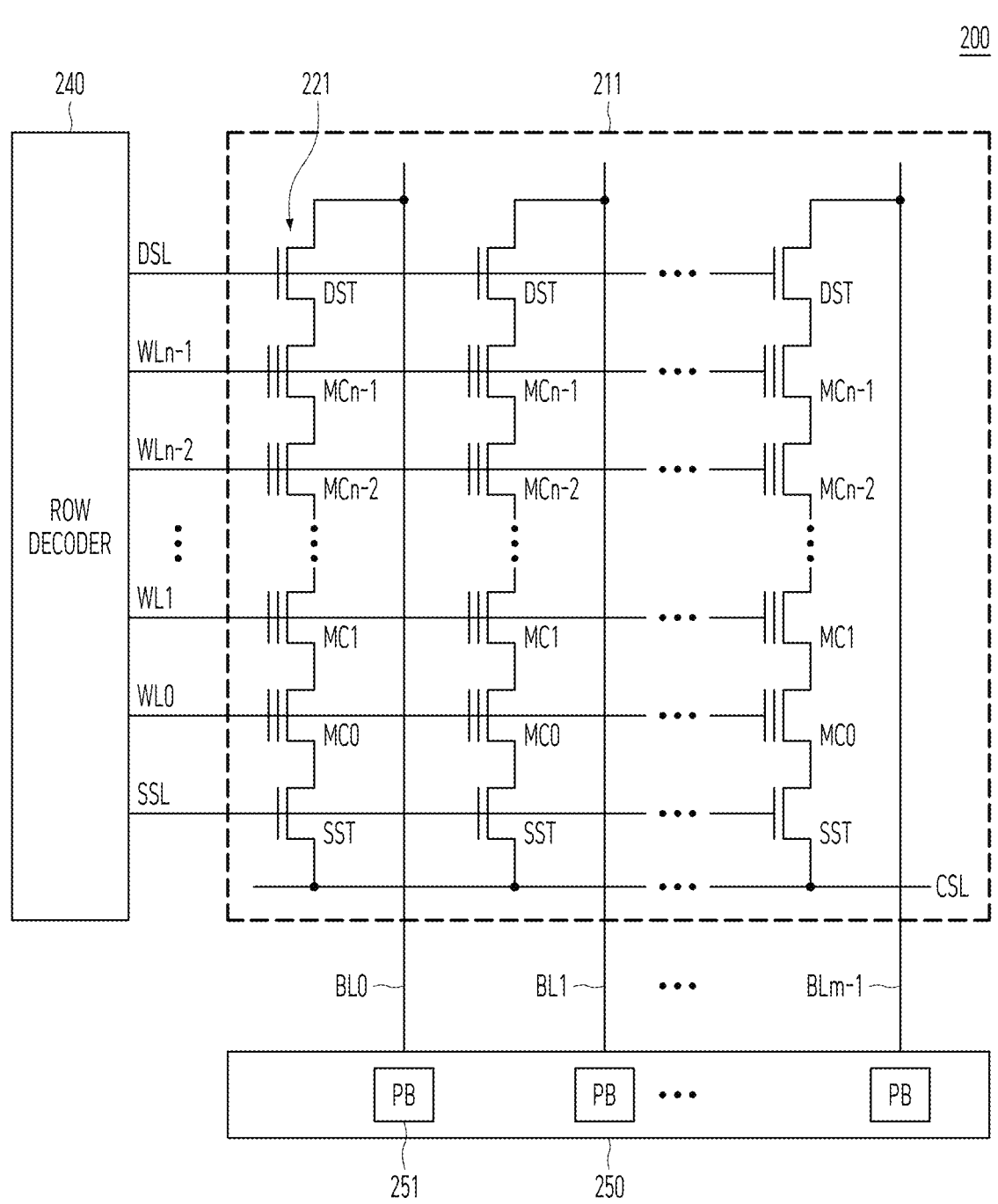
FIG. 4 is a circuit diagram illustrating a memory block of a memory device in accordance with embodiments of the present invention.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

The page buffer 250 may include a plurality of separate page buffers PB 251 that are coupled to the bit lines BL0 to BLm−1. The page buffers PB 251 may operate in response to page buffer control signals. For example, the page buffers PB 251 my temporarily store data received through the bit lines BL0 to BLm−1 or sense voltages or currents of the bit lines during a read or verify operation.

Figure 5:
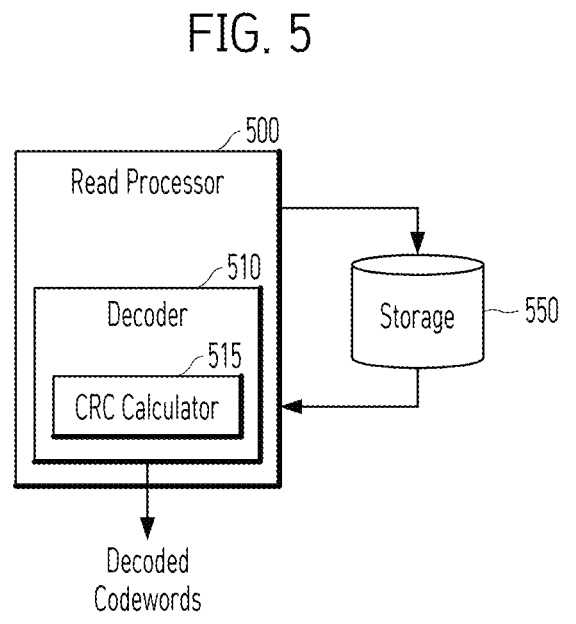

FIG. 5 is a diagram illustrating a storage system in accordance with embodiments of the present invention.

Referring to FIG. 5, the storage system may include a storage 550 and a memory controller such as a read processor 500. The read processor 500 may perform a read operation for data stored in the storage 550. During the read operation, the read processor 500 may read data from the storage 550, which may include some noise or errors, and perform error correction for the read data. In some embodiments, the read processor 500 may include a decoder 510, for example, an LDPC decoder which may perform LDPC decoding and/or a horizontal layer decoding (HLD) described in detail below. The decoder 510 may also perform BF decoding and MS decoding. The read processor 500 may include a receiver for receiving data from the storage 550.

When the stored data in the storage 550 is requested or otherwise desired (e.g., by an application or user which stored the data), the decoder 510 may receive data from the storage 550. The received data may include some noise or errors. The decoder 510 may perform detection on the received data and output decision and/or reliability information. The decoder 510 may include one of a soft detector and a hard detector. Either the soft detector or the hard detector can provide channel information for decoders. For example, the soft detector may output reliability information and a decision for each detected bit. On the other hand, the hard detector may output a hard decision on each bit without providing corresponding reliability information. As an example, the hard detector may output as the hard decision that a particular bit is a "1" or a "0" without indicating how certain or sure the detector is in that decision. In contrast, the soft detector may output a decision and reliability information associated with the decision. In general, reliability information indicates how certain the detector is in a given decision. In one example, the soft detector may output a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

In various embodiments, the system shown in FIG. 5 may be implemented using a variety of techniques including an application-specific integrated circuit (ASIC), a field-programmable gate array (FPGA), and/or a general purpose processor (e.g., an Advanced RISC Machine (ARM) core).

Figure 6A:
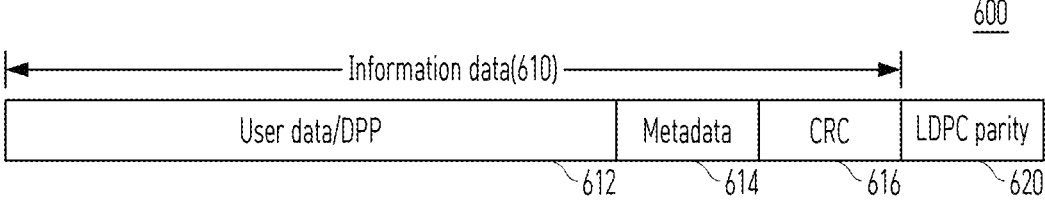
FIG. 6A is a diagram illustrating a format of a codeword to be stored in a storage system in accordance with embodiments of the present invention.

FIG. 6A is a diagram illustrating a format of a codeword 600 to be stored in a storage system. Referring to FIG. 6A, the codeword 600 may include information data 610 and parity 620. In some embodiments, the codeword 600 may be generated by low-density parity-check (LDPC) codes. In other words, the information data 610 may be protected by LDPC codes, and the parity 620 may be LDPC parity. The information data 610 may include user data with data path protection (DPP) 612, meta-data 614 and cyclic redundancy check (CRC) parity bits 616. A CRC code is an error-detecting code used in digital networks and storage devices to detect changes to raw data.

In a typical LDPC decoder, if the LDPC checksum is zero, the decoder may be terminated. The CRC parity bits 616 will be computed based on the decoded user data 612 and meta-data 614. If the computed CRC parity bits match the decoded CRC parity bits, decoding may be successful. Otherwise, a mis-correction may be declared.

In some embodiments of the present invention, it is supposed that x=[x_0, x_1, . . . , x_(N−1)] is a bit vector, and H=[hi, j] is an M×N low-density parity-check matrix with a binary value hi, j at the intersection of row i and column j. Then each row of H provides a parity check for x. If x is a codeword of H, it has xHT=0, where HT is referred to as the syndrome.

Figure 6B:
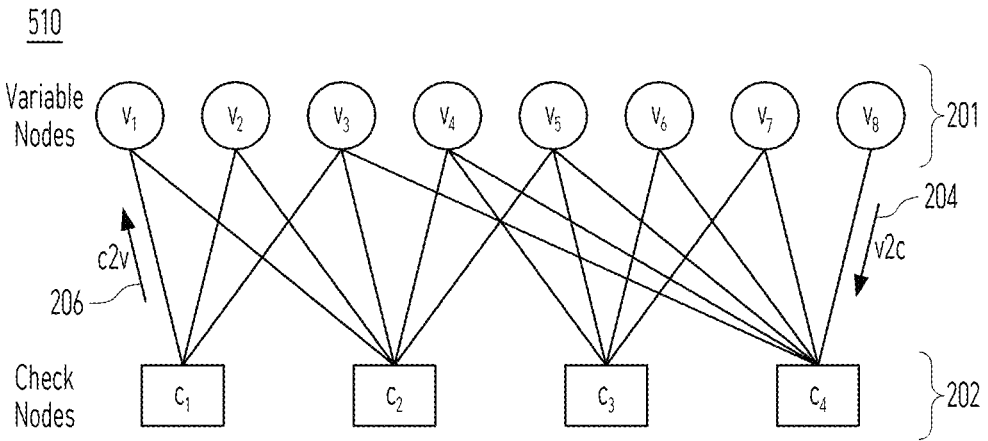
FIG. 6B is a diagram illustrating a Tanner graph in accordance with embodiments of the present invention.

FIG. 6B is a diagram of a bipartite graph showing aspects of node communications in decoder 510. The decoder 510 includes a number of variable nodes 201, which are part of a variable node unit (VNU). A total of eight variable nodes (VNs) 201 are shown in FIG. 6B, labelled as v1-v8. The VNs 201 communicate with a series of check nodes (CNs) 202 that are part of a check node unit (CNU) described in more detail below. A total of four check nodes are shown in FIG. 6B, labelled as c1-c4. Other respective numbers and arrangements of the respective nodes 201, 202 can be provided. The lines connecting the variable nodes 201 to the check nodes 202 represent two-way communications paths for transmitting messages therebetween. These messages may go from variable to check node as indicated by v2c direction 204 or from check to variable node, as indicated by c2v direction 206.

When LDPC decoding is used, a syndrome update may check to see if all of the errors have been removed from a codeword containing user data or bit data. For example, if for the parity-check matrix H, the LDPC syndrome vector ĉH=0, and thus the checksum representing the number of nonzero elements in the syndrome vector is 0, then the syndrome update can determine that decoding is successful and all errors have been removed from the codeword. If so, the LDPC decoding stops decoding and outputs ĉ=[ĉ1, ĉ2, . . . ĉN] as the decoded output.

If the LDPC checksum is not equal to zero and thus the LDPC checksum is not equal to zero, the decoded codeword (i.e., ĉ) is not output and another decoding iteration is performed until a maximum number of iterations, which may be predefined, is reached. In other words, a variable node update calculates new variable to check node (V2C) messages and new log likelihood ratios (LLR) values, the check node update calculates new check to variable node (C2V) messages, and the codeword update calculates a new codeword and checks if the product of the new codeword and the parity check matrix is 0, that is ĉH=0.

Inventive CRC Calculator

Referring back to FIG. 5, decoder 510 can includes a CRC calculator 515 used for calculating CRC parity bits. In a typical error correction code (ECC) scheme, CRC calculator 515 applies CRC calculations to the payload portion 710 of the codeword with the CRC-generated parity portion 712 appended to the payload portion 710 to protect against mis-correction and to ensure data integrity. CRC parity information may be calculated by ways known in the art such as for example, having input data to be stored in the memory device divided by a predetermined polynomial, and a CRC code is generated by adding the remainder to an end portion of the input data. That is, in a CRC encoding operation, a CRC code is generated by adding the remainder as CRC parity information to the data. When stored data is read from a memory and divided by the predetermined polynomial and the remainder is zero, there is no error in the read data.

Figure 7:
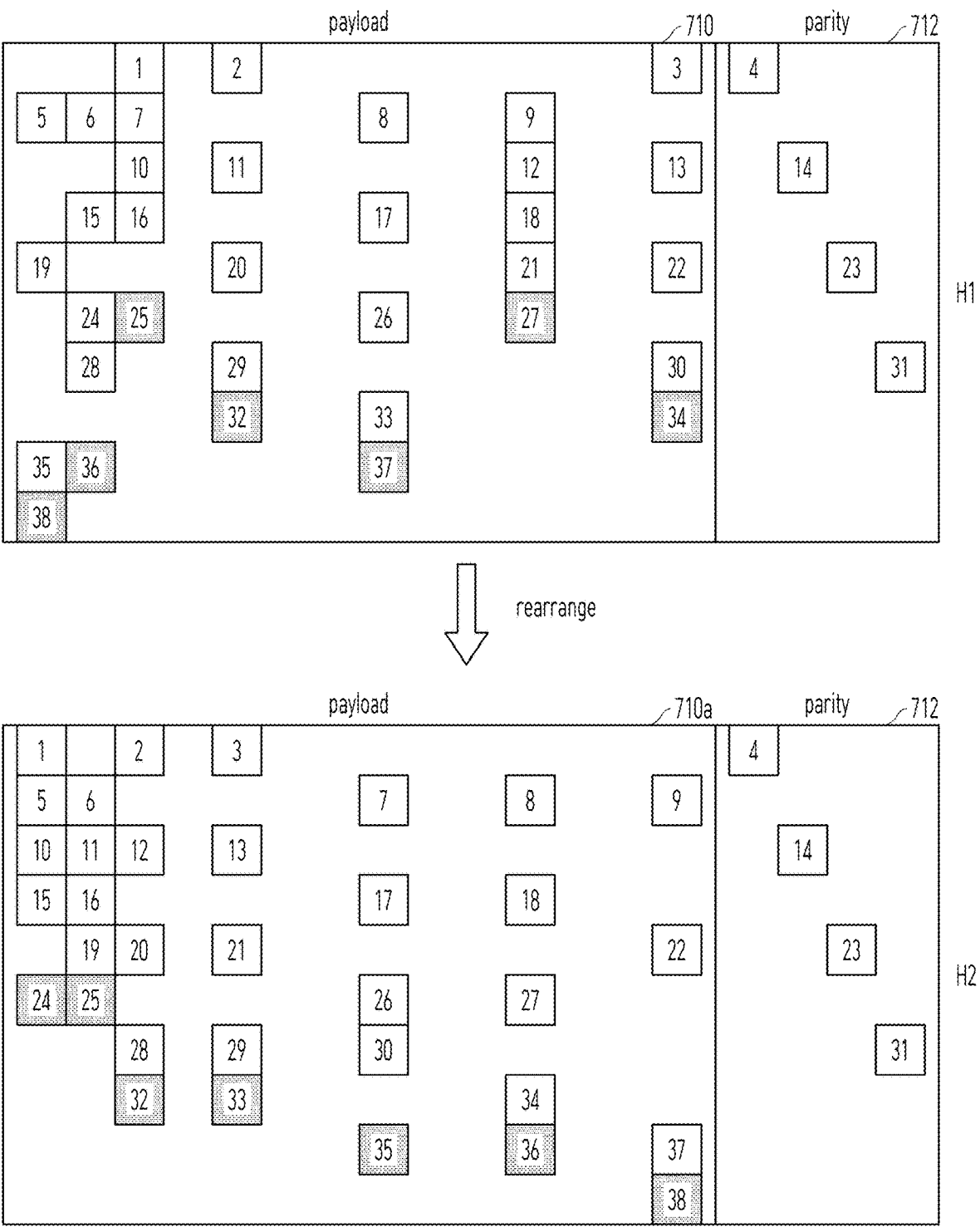
FIG. 7 is a depiction of error correction parity check matrices for on-the-fly horizontal layer error code processing of data in accordance with embodiments of the present invention.

With reference to FIG. 7, FIG. 7 (at the top) depicts a parity-check matrix H1 composed of a payload portion (of user data) 710 including e.g., circulants 1, 2, 3, 5, 6, 7, etc. and a parity portion 712 including e.g., circulants 4, 14, 23, and 31. Decoder 510 can apply Horizontal layered decoding (HLD) to circulants in the payload portion 710 and circulants in the parity portion 712 in the parity-check matrix H on a row-by-row basis indicated by the numerical order seen in the top schematic of FIG. 7. In other words, horizontal layered decoding by decoder 510 processes circulants row by row and from left to right. After processing each circulant, hard-decision bit values can be updated.

A typical way to check CRC is to encode the payload portion 710 again and check against the original CRC parity bits. After decoding is finished (with errors corrected), data is ready to be transferred to an output buffer. If the CRC parity can be calculated on-the-fly in each iteration, a decoder can terminate decoding when the payload portion 710 is error-free. This helps reduce decoding latency, improve decoder throughput and correction capability.

However, due to the fact that the order of processing is not sequential in HLD at each iteration, how to calculate CRC on-the-fly becomes difficult. The present disclosure provides methods for on-the-fly CRC calculation with HLD.

Order of Processing in an HLD

As noted above, the numbering of the circulants for H1 in the top half of FIG. 7 represents the order of how the circulants are typically processed by in HLD. As noted above, horizontal layered decoding processes circulants row by row and from left to right.

Out-of-Order CRC Calculation

In each circulant column, the last circulant is denoted as bottom circulant and indicated by the shaded circulants shown in H1. For a general parity-check matrix, the bottom circulants may not be on the same or common row (as shown in the top half of FIG. 7). The CRC encoding performed by CRC calculator 515 encodes a payload portion column by column sequentially. On-the-fly CRC calculations is difficult as decoder 510 visits circulant columns in an out-of-order fashion. For example, in FIG. 7, HLD of H1 by decoder 510 will decode 3rd column first, then 4th column, and 7th column and so on.

Below two methods according to the present invention for on-the-fly CRC calculation for HLD are described.

Method-1

For any parity check matrix that has k payload columns, labeled from column 1 to k, decoder 510 re-orders the columns in the payload portion 710 so that for all i, where $i=[2, 3, \ldots, k]$ is a column index in payload portion, $b(i)>=b(i-1)$, where $b(j)$ is the row index of the bottom circulant of column j. As an example of this re-ordering is shown in the lower half of FIG. 7 where the column permutation converts H1 to H2. As shown there, circulants in the payload portion 710 on the same row are shifted within the same row (with no shifting of the circulants in the parity portion 712). The shifting produces a party check matrix H2 having a bottom-sorted form, meaning that horizontal layered decoding, which processes circulants row by row and from left to right, processes the bottom circulants in a sequential order such that circulants 24, 25, 32, 33, 35, 36, and 38 are processed in order of their column indices i.

After converting the parity check matrix from general form (e.g., H1) into bottom-sorted form (e.g., H2), CRC can be calculated in an HLD decoder on-the-fly once in each iteration after encoding a payload portion of circulants in the same column. In particular, in the cycle 24, 25, 32, 33, 35, 36, and 38, CRC encoding logic included in CRC calculator 515 will take the updated hard-decision bits (output from each payload portion of circulants in the same columns) as input to a linear feedback shift register (LSFR) circulant and update the register values associated for example with LLR. For other cycles, not processing circulants 24, 25, 32, 33, 35, 36, and 38, the CRC encoding logic will stay idle, and the register values will be kept unchanged.

Method 2

Another way to perform a CRC on-the-fly calculation includes a) using the bottom-sorted parity check matrix H2 as the ECC encoding matrix, encoding the payload portion of H2 with an LDPC parity appended thereto, b) calculating the CRC parity based on the encoded payload portion of H2, and then c) permutating the encoded payload portion according to H1 matrix (as if H1 is the parity check matrix of the permuted codeword) such that the permuted codeword satisfies the calculated CRC parity. For example, denote the payload portion of the bottom-sorted form H2 as $cw2=[c1, c2, c3, c4, c5, c6, c7]$, where ci is a length q binary vector, where q is the size of the circulant. In order to permute cw2 into cw1 that is compatible to parity check matrix of H1, write cw2 as $cw1=[c7, c5, c1, c3, c6, c2, c4]$, where the syndrome of $[c7, c5, c1, c3, c6, c2, c4]$ and H1 shows no errors as the reordering forces the entry values (such as 1s and 0s) of the permuted codeword to match the entry values in the parity portion of H1. After such permutation, cw1 as $[c7, c5, c1, c3, c6, c2, c4]$ will be written to NAND with perhaps additional processing such as scrambling etc.

In one embodiment of the present invention, the NAND stored format may be different from the H2 format. For example, for irregular codes, the H2 format may change the degree (the number of 1's) of consecutive columns. Regardless, the ECC decoder can sort all columns with a degree close to each other, and method 2 is used for CRC calculation.

In one embodiment, HLD can read back a noisy version of cw1 ($[c7', c5', c1', c3', c6'c2', c4']$) and decode the noisy version of cw1, and the CRC can be calculated on-the-fly at cycle 25, 27, 32, 34, 36, 37 and 38 (the order of processing the bottom circulants of H1). The CRC updates an internal state of the payload data based on the payload data, and stores the internal state as CRC parity in the meta data portion. Unless there are errors in the codewords due to for example noise in reading the codewords from memory, this procedure provides a valid CRC parity calculation because the CRC parity bits in the ECC encoding process is calculated in the same order as the bottom circulants in the general form H1 were processed.

Computerized Method

In one embodiment of the present invention, there is provided a method (as depicted in FIG. 8) for on-the-fly horizontal layer processing of data for memory storage and retrieval. In this method, at 801, a parity check matrix H1 is generated including a payload portion and a parity portion, wherein the payload portion contains layers of user data circulants and the parity portion contains layers of parity data circulants. In this method, at 803, the data circulants within rows of the payload portion are rearranged to different row positions. In this method, at 805, a bottom-sorted party check matrix H2 is formed from the rearranged data circulants. In this method, at 807, the bottom-sorted party check matrix H2 can be processed using horizontal layer decoding to correct errors in stored codewords of the data retrieved from memory. Due to this rearrangement, horizontal layer processing of the bottom-sorted party check matrix H2 sequentially processes for error correction bottom circulants in each column in an order associated with a column index i.

In this method, the rearrangement re-orders the columns in the payload portion so that for all column indices i, where i=[2, 3, . . . , k] is a column index in payload portion, b(i)>=b(i−1), where b(j) is the row index of the bottom circulant of column j.

In this method, the rearrangement shifts data circulants in the payload portion on the same row with no shifting of the parity circulants.

In this method, the parity portion contains cyclic redundant shift parity values.

In this method, after the rearrangement, only the bottom circulants in the bottom-sorted party check matrix H1 are error checked by cyclic redundancy checking (CRC), and CRC encoding logic updates hard-decision bits for the bottom circulants. In this method, the hard-decision bits may update register values for changing bit values in the user data circulants.

Figure 9:
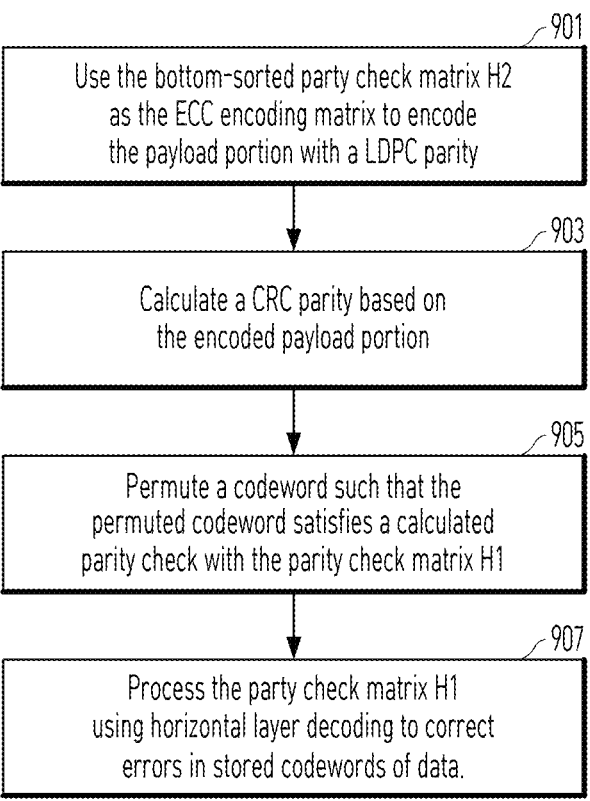
FIG. 9 is a flow chart illustrating another method for on-the-fly horizontal layer error code processing of data for memory storage and retrieval according to another embodiment of the present invention.

The method of the present invention includes, as illustrated in FIG. 9, at 901, using the payload portion of the bottom-sorted form parity check matrix H2 as an ECC encoding matrix to encode the payload portion with an initial CRC parity appended thereto. At 903, the method includes calculating a CRC parity based on the encoded payload portion of H2. At 905, the method includes permutating a codeword (for subsequent storage in a memory) such that the permuted codeword satisfies a calculated parity check with the parity check matrix H1. In other words, the permuted codeword is compatible with H1 because (once permuted) the data bit values in the payload portion 710 of H2 match the data bit values in the payload portion 710 of H1. At 907, the method includes processing the party check matrix H1 using horizontal layer decoding to correct errors in stored codewords. In this method, the horizontal layer processing can read back and decode a noisy version of a codeword.

Memory System

In another embodiment of the present invention, there is provided a memory system (such as in FIG. 3) having a storage; and a processor configured to: generate a parity check matrix H1 including a payload portion and a parity portion, wherein the payload portion contains layers of user data circulants and the parity portion contains layers of parity data circulants; rearrange data circulants within rows of the payload portion to different row positions; and form a bottom-sorted party check matrix H2 from the rearranged data circulants.

In this memory system, the processor can be further configured to: process the bottom-sorted party check matrix H2 using horizontal layer decoding to correct errors in stored codewords of the data retrieved from the storage.

In this memory system, horizontal layer processing of the bottom-sorted party check matrix H1 sequentially processes for error correction bottom circulants in each column in an order associated with a column index i. The rearrangement may re-order the columns in the payload portion so that for all column indices i, where i=[2, 3, . . . , k] is a column index in payload portion, b(i)>=b(i−1), where b(j) is the row index of the bottom circulant of column j. The rearrangement may shift data circulants in the payload portion on the same row with no shifting of the parity circulants.

In the memory system, the parity portion may contain cyclic redundant shift parity values wherein, after the rearrangement, only the bottom circulants in the bottom-sorted party check matrix H2 are error checked by cyclic redundancy checking (CRC).

In the memory system, CRC encoding logic may update hard-decision bits for the bottom circulants. In the memory system, the hard-decision bits may update register values for changing bit values in the user data circulants.

In the memory system, the processor may be configured to: use the bottom-sorted parity check matrix H2 as the ECC encoding matrix to encode the payload portion with an initial CRC parity appended thereto; calculate a CRC parity based on the encoded payload portion of the bottom-sorted parity check matrix H2, permute a codeword such that the permuted codeword satisfies a calculated parity check with the parity check matrix H1; and process the party check matrix H1 using horizontal layer decoding to correct errors in stored codewords when read in order of the permuted codeword.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field-programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for on-the-fly horizontal layer error code processing of data for memory storage and retrieval, comprising:

generating a parity check matrix including a payload portion and a parity portion, wherein the payload portion contains layers of user data circulants and the parity portion contains layers of parity data circulants;

rearranging user data circulants, within respective rows of the payload portion, to different row positions in a same row, with no shifting of the parity data circulants;

the rearranging of the user data circulants forming a bottom-sorted party check matrix including the rearranged user data circulants, wherein bottom circulants of the bottom-sorted party check matrix are arranged in a horizontal-layer sequential order; and after the rearrangement, error-checking in the horizontal-layer sequential order using only the bottom circulants of the bottom-sorted party check matrix.

2. The method of claim 1, further comprising processing the bottom-sorted party check matrix using horizontal layer decoding to correct errors in stored codewords of the data retrieved from memory.

3. The method of claim 1, wherein, after the rearrangement, horizontal layer processing in the horizontal-layer sequential order the bottom-sorted party check matrix for error correction using the bottom circulants in each column in an order associated with a column index i.

4. The method of claim 1, wherein the rearrangement re-orders the columns in the payload portion so that for all column indices i, where $i=[2, 3, \ldots, k]$ is a column index in payload portion, $b(i) >= b(i-1)$, where $b(j)$ is the row index of the bottom circulant of column j.

5. The method of claim 1, wherein the parity portion contains cyclic redundant shift parity values.

6. The method of claim 1, wherein, the bottom circulants in the bottom-sorted party check matrix are error checked by cyclic redundancy checking (CRC).

7. The method of claim 6, wherein CRC encoding logic updates hard-decision bits for the bottom circulants.

8. The method of claim 7, wherein the hard-decision bits update register values for changing bit values in the user data circulants.

9. The method of claim 6, further comprising:

using the bottom-sorted parity check matrix as an ECC encoding matrix to encode the payload portion with an initial CRC parity appended thereto;

calculating a CRC parity based on the encoded payload portion of the bottom-sorted parity check matrix;

permuting a codeword such that the permuted codeword satisfies a calculated parity check with the parity check matrix; and processing the party check matrix using horizontal layer decoding to correct errors in stored codewords when read in order of the permuted codeword.

10. A memory system, comprising:

a storage; and a processor configured to:

generate a parity check matrix H1 including a payload portion and a parity portion, wherein the payload portion contains layers of user data circulants and the parity portion contains layers of parity data circulants;

rearrange user data circulants, within respective rows of the payload portion, to different row positions in a same row, with no shifting of the parity data circulants;

form from rearranged user data circulants a bottom-sorted party check matrix including the rearranged user data circulants, wherein bottom circulants of the bottom-sorted party check matrix are arranged in a horizontal-layer sequential order; and after the rearrangement, error-check in the horizontal-layer sequential order using only the bottom circulants of the bottom-sorted party check matrix.

11. The memory system of claim 10, wherein the processor is further configured to: process the bottom-sorted party check matrix using horizontal layer decoding to correct errors in stored codewords of the data retrieved from memory.

12. The memory system of claim 11, wherein, after the rearrangement, horizontal layer processing in the horizontal-layer sequential order the bottom-sorted party check matrix for error correction using the bottom circulants in each column in an order associated with a column index i.

13. The memory system of claim 11, wherein the rearrangement re-orders the columns in the payload portion so that for all column indices i, where i=[2, 3, . . . , k] is a column index in payload portion, b(i)>=b(i−1), where b(j) is the row index of the bottom circulant of column j.

14. The memory system of claim 11, wherein the parity portion contains cyclic redundant shift parity values.

15. The memory system of claim 11, wherein the bottom circulants in the bottom-sorted party check matrix are error checked by cyclic redundancy checking (CRC).

16. The memory system of claim 11, wherein CRC encoding logic updates hard-decision bits for the bottom circulants.

17. The memory system of claim 16, wherein the hard-decision bits update register values for changing bit values in the user data circulants.

18. The memory system of claim 11, wherein the processor is configured to:

use the bottom-sorted parity check matrix as an ECC encoding matrix to encode the payload portion with an initial CRC parity appended thereto;

calculate a CRC parity based on the encoded payload portion of the bottom-sorted parity check matrix;

permute a codeword such that the permuted codeword satisfies a calculated parity check with the parity check matrix; and process the party check matrix using horizontal layer decoding to correct errors in stored codewords when read in order of the permuted codeword.

\* \* \* \* \*